United States Patent
Tomonari et al.

(10) Patent No.: US 7,446,632 B2
(45) Date of Patent: Nov. 4, 2008

(54) COMMON MODE CHOKE COIL

(75) Inventors: Toshio Tomonari, Tokyo (JP);
Tomokazu Ito, Tokyo (JP); Toshihiro Kuroshima, Tokyo (JP)

(73) Assignee: TDK Corporation, Tokyo (JP)

( * ) Notice: Subject to any disclaimer, the term of this patent is extended or adjusted under 35 U.S.C. 154(b) by 272 days.

(21) Appl. No.: 11/392,553

(22) Filed: Mar. 30, 2006

(65) Prior Publication Data
US 2006/0238273 A1 Oct. 26, 2006

(30) Foreign Application Priority Data
Mar. 31, 2005 (JP) .............................. 2005-104183

(51) Int. Cl.
*H03H 7/00* (2006.01)
(52) U.S. Cl. ...................... 333/185; 336/200
(58) Field of Classification Search ................. 333/185; 336/200
See application file for complete search history.

(56) References Cited

U.S. PATENT DOCUMENTS 6,370,404 B1 * 4/2002 Shen .......................... 505/210

FOREIGN PATENT DOCUMENTS

| JP | A-8-203737 | 8/1996 |
| JP | A 9-199327 | 7/1997 |
| JP | A-11-054326 | 2/1999 |
| JP | A 2000-58323 | 2/2000 |
| JP | A-2003-217932 | 7/2003 |
| JP | A-2003-532285 | 10/2003 |
| JP | A-2004-047849 | 2/2004 |
| JP | A 2004-260008 | 9/2004 |
| JP | 2004-304118 | * 10/2004 |
| JP | A 2005-26268 | 1/2005 |
| JP | 2005-268603 | * 9/2005 |
| WO | WO 01/82317 A1 | 11/2001 |

* cited by examiner

*Primary Examiner*—Benny Lee
*Assistant Examiner*—Kimberly E Glenn
(74) *Attorney, Agent, or Firm*—Oliff & Berridge, PLC

(57) ABSTRACT

A common mode choke coil has a first coil element and a second coil element. The first coil element is configured of a first coil pattern and a second coil pattern. Each of the first and second coil patterns has two ends and is spiral-shaped therebetween. The spirals of the two patterns are wound in the same direction. The second coil element has a shape identical to the first coil element and includes a third coil pattern corresponding to the first coil pattern and a fourth coil pattern corresponding to the second coil pattern.

7 Claims, 4 Drawing Sheets

140(160)

240(260)

COMMON MODE CHOKE COIL

BACKGROUND OF THE INVENTION

The present invention relates to a common mode choke coil, and particularly to a common mode choke coil not susceptible to the effects of external noise.

Various structures have been proposed for common mode choke coils. One such common mode choke coil proposed in Japanese unexamined patent application publication No. 2003-217932 has two spiral coil elements disposed adjacent to each other but separated by an insulating layer. The two coil elements can be magnetically coupled.

SUMMARY OF THE INVENTION

However, when this conventional common mode choke coil is used in the common mode, part of the magnetic paths formed by the first and second coil elements exists outside the common mode choke coil. As a result, magnetic flux leakage occurs outside the common mode choke coil, lowering the impedance (inductance) produced from the magnetic field that is generated by the first and second coils. Further, external magnetic noise introduced into the first and second coil elements causes an electric current to flow. This electric current becomes a noise component in the signal transmission circuit.

In view of the foregoing, it is an object of the present invention to provide a common mode choke coil capable of preventing a drop in impedance (inductance) generated by the coils in the common mode and capable of preventing external magnetic noise from generating a noise component.

This and other object of the present invention with be attained by providing a common mode choke coil including a laminate structure. The laminate structure has a plurality of insulating layers, a first coil element, and a second coil element.

The first coil element includes a first coil pattern and a second coil pattern. The first coil pattern has two first ends and a spiral shape therebetween. The second coil pattern has two second ends. One of the second ends is connected to one of the first ends, and a spiral shape wound in the same direction as the first coil pattern.

The second coil element is disposed adjacent to the first coil element with one of the plurality of insulating layers interposed therebetween. The second coil element includes a third coil pattern and a fourth coil pattern. The third coil pattern is capable of being magnetically coupled to the first coil pattern and has two third ends with a spiral shape wound in the same direction as the first coil pattern. The fourth coil pattern is capable of being magnetically coupled to the second coil pattern and having two fourth ends. One of the fourth ends is connected to one of the third ends and a spiral shape wound in the same direction as the third coil pattern

DESCRIPTION OF THE PREFERRED EMBODIMENTS

Figure 1:
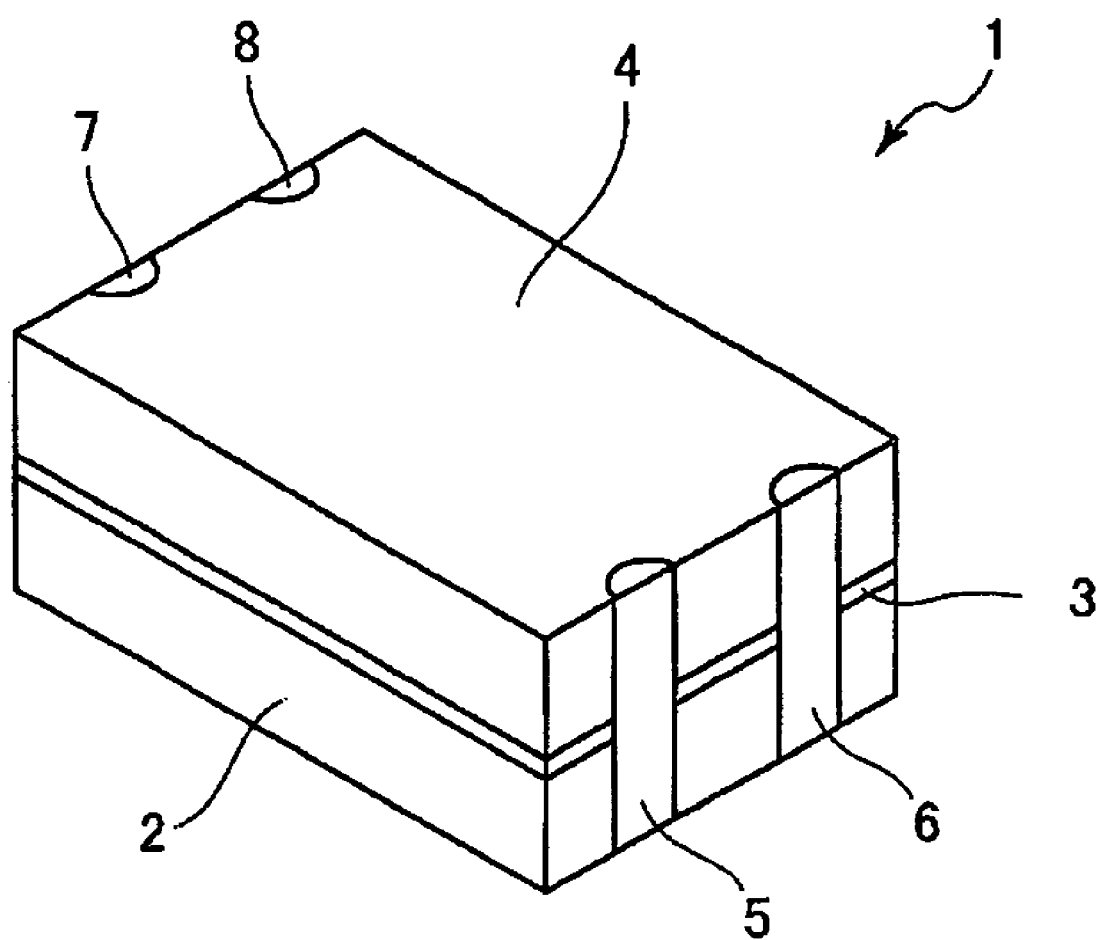
FIG. 1 is a perspective view of a common mode choke coil according to a preferred embodiment of the present invention.
Figure 2:
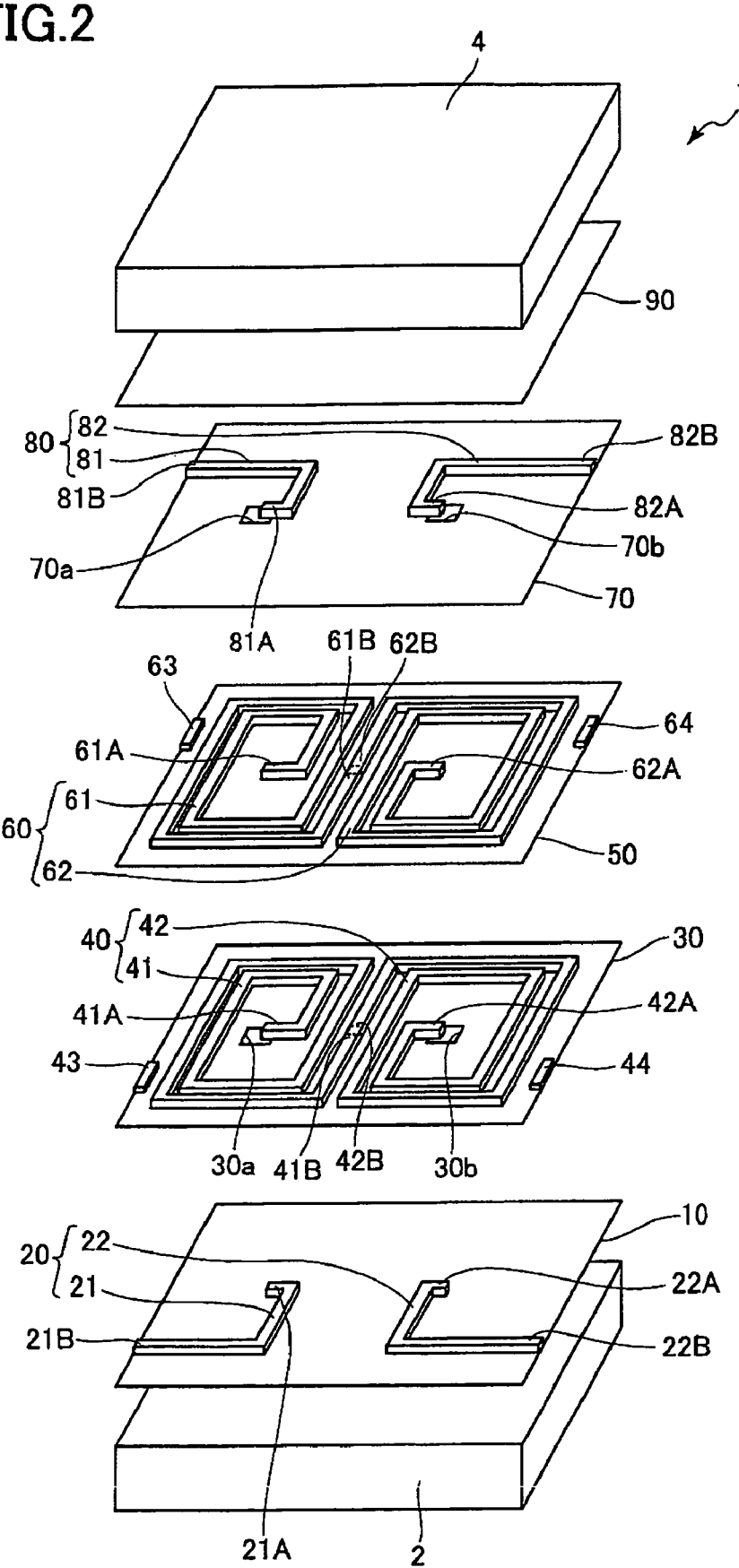
FIG. 2 is an exploded perspective view of the common mode choke coil according to the preferred embodiment.

A common mode choke coil 1 according to a preferred embodiment of the present invention will be described while referring to FIGS. 1 through 4. FIG. 1 is a perspective view of the common mode choke coil 1. FIG. 2 is an exploded perspective view of the common mode choke coil 1. As shown in the drawings, the common mode choke coil 1 according to the preferred embodiment includes a first magnetic member 2, a laminated structure 3, a second magnetic member 4, and external electrodes 5-8.

The first magnetic member 2 is plate-shaped and formed of a magnetic material such as sintered ferrite, composite ferrite (a resin containing powdered ferrite), or the like.

The laminated structure 3 is disposed on a primary surface side of the first magnetic member 2. The laminated structure 3 is formed according to a thin film forming technology of superposing a plurality of layers. As shown in FIG. 2, the laminated structure 3 includes a first insulating layer 10, a first lead-out electrode 20, a second insulating layer 30, a first coil element 40, a third insulating layer 50, a second coil element 60, a fourth insulating layer 70, a second lead-out electrode 80, and a fifth insulating layer 90.

The first insulating layer 10 is disposed on the primary surface side of the first magnetic body 2 and is formed of a polyimide resin, epoxy resin, or other resin material having excellent electric and magnetic insulating properties and excellent machining properties. The first insulating layer 10 moderates irregularities in the primary surface of the first magnetic body 2.

The first lead-out electrode 20 is formed on top of the first insulating layer 10. The first lead-out electrode 20 includes a first lead-out part 21 having two first lead-out ends 21A and 21B, and a second lead-out part 22 having two second lead-out ends 22A and 22B. The first lead-out end 21A is positioned on the inner side of the first insulating layer 10, while the first lead-out end 21B leads from the first lead-out end 21A to a side surface of the laminated structure 3. The second lead-out end 22A is positioned on the inner side of the first insulating layer 10, while the second lead-out end 22B leads from the second lead-out end 22A to a side surface of the laminated structure 3 on the opposite side from the first lead-out part 21.

The second insulating layer 30 is disposed on a side of the first lead-out electrode 20 opposite the first insulating layer 10. Like the first insulating layer 10, the second insulating layer 30 is also formed of a polyimide resin, epoxy resin, or other resin material having excellent electric and magnetic insulating properties and excellent machining properties. The second insulating layer 30 is formed with a first through-hole 30a and a second through-hole 30b at positions corresponding to the first and second lead-out ends 21A and 22A, respectively.

The first coil element 40 is formed on top of the second insulating layer 30. The first coil element 40 includes a first coil pattern 41 having two first coil ends 41A and 41B, and a second coil pattern 42 having two second coil ends 42A and 42B. The first coil end 41A opposes and connects to the first lead-out end 21A via the first through-hole 30a. The first coil end 41B is positioned farther inside on the second insulating layer 30 than the first coil end 41A.

The second coil end 42A opposes and connects to the second lead-out end 22A via the second through-hole 30b. The second coil end 42B is positioned farther on the inside of the second insulating layer 30 than the second coil end 42A and connects to the first coil end 41B. The first coil pattern 41 forms a spiral shape between the first coil ends 41A and 41B, while the second coil pattern 42 also forms a spiral shape wound in the same direction as the first coil pattern 41 between the second coil ends 42A and 42B. The shape of the spiral is not limited to a substantially circular appearance, but may also be a square shape or a polygonal shape formed of at least one of curved and straight lines.

The first and second coil patterns 41 and 42 are symmetrical to each other about a point of connection between the first coil end 41B and the second coil end 42B. The first coil element 40 also includes an electrode 43 disposed at a side edge of the second insulating layer 30 opposing the first lead-out end 21B, and an electrode 44 disposed at a side edge of the second insulating layer 30 opposing the second lead-out end 22B.

The third insulating layer 50 is disposed on the side of the first coil element 40 opposite the second insulating layer 30. As with the first insulating layer 10, the third insulating layer 50 is formed of polyimide resin, epoxy resin, or other resin material having excellent electric and magnetic insulating properties and excellent machining properties.

The second coil element 60 is formed on the third insulating layer 50. The second coil element 60 is shaped similar to the first coil element 40 and is disposed at a position corresponding to that of the first coil element 40. The second coil element 60 includes a third coil pattern 61 corresponding to the first coil pattern 41, and a fourth coil pattern 62 corresponding to the second coil pattern 42. As with the first coil pattern 41, the third coil pattern 61 has two third coil ends 61A and 61B. As with the second coil pattern 42, the fourth coil pattern 62 has two fourth coil ends 62A and 62B. The third coil pattern 61 has the same shape as the first coil pattern 41, while the fourth coil pattern 62 has the same shape as the second coil pattern 42.

Since the first coil element 40 and the second coil element 60 are disposed in opposition to each other, a magnetic flux generated by a current flowing through one of the coils will enter the other coil. Accordingly, the first and second coil elements 40 and 60 are arranged so that they can be magnetically coupled. The second coil element 60 also includes an electrode 63 disposed on a side edge of the third insulating layer 50 opposing the electrode 43 but at a position not overlapping the electrode 43, and an electrode 64 disposed on a side edge of the third insulating layer 50 opposing the electrode 44 but at a position not overlapping the electrode 44.

The fourth insulating layer 70 is disposed on a side of the second coil element 60 opposite the third insulating layer 50. As with the first insulating layer 10, the fourth insulating layer 70 is formed of polyimide resin, epoxy resin, or other resin material having excellent electric and magnetic insulating properties and excellent machining properties. The fourth insulating layer 70 is formed with a third through-hole 70a and a fourth through-hole 70b at positions corresponding to the third coil end 61B and fourth coil end 62B on the third insulating layer 50.

The second lead-out electrode 80 includes a third lead-out part 81 having two third lead-out ends 81A and 81B, and a fourth lead-out part 82 having two fourth lead-out ends 82A and 82B. The third lead-out end 81A opposes and is connected to the third coil end 61A via the third through-hole 70a. The third lead-out end 81B leads from the third lead-out end 81A to a side surface of the laminated structure 3 at a position opposing the electrode 63.

The fourth lead-out end 82A opposes and is connected to the fourth coil end 62A via the fourth through-hole 70b. The fourth lead-out end 82B leads from the fourth lead-out end 82A to a side surface of the laminated structure 3 at a position opposing the electrode 64.

The fifth insulating layer 90 is disposed on a side of the second lead-out electrode 80 opposite the fourth insulating layer 70. As with the first insulating layer 10, the fifth insulating layer 90 is formed of polyimide resin, epoxy resin, or other resin material having excellent electric and magnetic insulating properties and excellent machining properties. The second magnetic member 4 is disposed on a side of the fifth insulating layer 90 opposite the second lead-out electrode 80. The second magnetic member 4 is plate-shaped and is formed of a magnetic material such as a sintered ferrite, composite ferrite, or the like.

The external electrodes 5 and 6 are formed across the outer surfaces of the superposed first magnetic member 2, laminated structure 3, and second magnetic member 4. The external electrode 5 is connected to the second lead-out end 22B and the electrode 44. Accordingly, the second lead-out end 22B and the electrode 44 are electrically connected via the external electrode 5. The external electrode 6 is connected to the fourth lead-out end 82B and the electrode 64. Accordingly, the fourth lead-out end 82B and the electrode 64 are electrically connected via the external electrode 6.

The remaining external electrodes 7 and 8 are formed in an opposing outer surface of the superposed first magnetic member 2, laminated structure 3, and second magnetic member 4 at positions opposing the external electrodes 5 and 6. The external electrode 7 is connected to the first lead-out end 21B and the electrode 43. Accordingly, the first lead-out end 21B and the electrode 43 are electrically connected via the external electrode 7. The external electrode 8 is connected to the third lead-out end 81B and the electrode 63. Accordingly, the third lead-out end 81B and the electrode 63 are electrically connected via the external electrode 8.

The common mode choke coil 1 having this construction is incorporated in a signal transmission circuit using a differential transmission method. As an example, the external electrodes 5 and 6 may be connected to an input side and the external electrodes 7 and 8 to an output side. The common mode choke coil 1 is employed as a differential mode for signals. In the differential mode, a signal is inputted into the first and second coil elements 40 and 60 in reverse directions so that magnetic fluxes flowing in different directions are generated in the first and second coil elements 40 and 60. Since the first coil pattern 41 and the third coil pattern 61 are shaped substantially the same and are disposed opposite each other, the magnetic fluxes produced by the two have substantially the same strength, canceling each other out so that almost no magnetic flux remains. The same occurs with the magnetic fluxes generated in the second coil pattern 42 and the fourth coil pattern 62. Therefore, almost no impedance (inductance) is generated by the magnetic field by the first coil element 40 and the second coil element 60 so that the signal is outputted with almost no decay.

Figure 3:
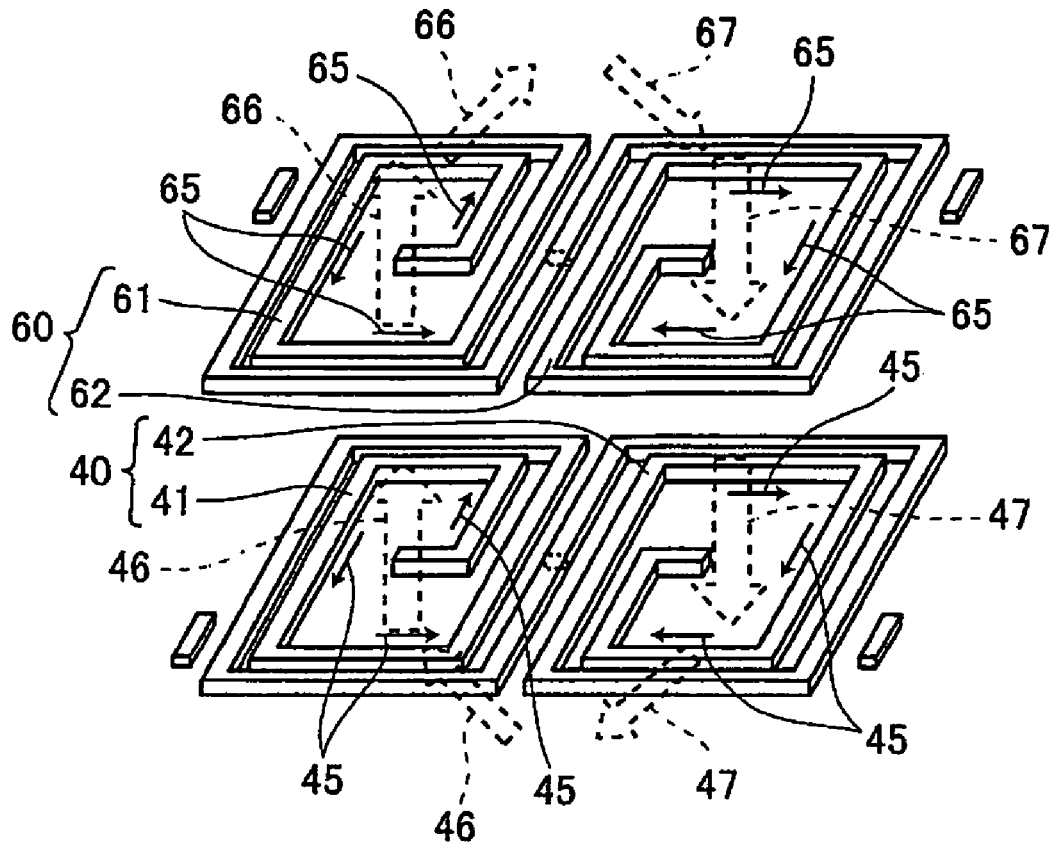
FIG. 3 is an explanatory diagram illustrating the flow of magnetic flux in the common mode choke coil of the preferred embodiment in the common mode.

However, the common mode choke coil 1 is used as a common mode for common mode signals 45 and 65, as shown in FIG. 3. In the common mode, the common mode signals 45 and 65 are generated in the same direction in both the first and second coil elements 40 and 60. The common mode signal 45 generates magnetic fluxes 46 and 47 in opposite directions from each other in the first and second coil patterns 41 and 42. Similarly, the common mode signal 65 generates magnetic fluxes 66 and 67 in opposite directions from each other in the third and fourth coil patterns 61 and 62.

These magnetic fluxes generated in opposite directions in the two neighboring coil patterns serve to strengthen each other, substantially forming a closed magnetic path. The magnetic field produced by the first and second coil elements 40 and 60 in this case increases the impedance so that very little of the common-mode signals 45 and 65 are outputted. In this way, the common-mode choke coil 1 can attenuate only noise.

Further, since it is possible to form a substantially closed magnetic path, there is no need to introduce a resin containing ferrite into the center of the coil pattern in order to prevent magnetic flux from escaping. Therefore, there is no need to form holes in the insulating layers for inserting a resin containing ferrite, thereby making the manufacturing process for the common mode choke coil 1 easier and cheaper. Further, by providing the first magnetic member 2 and second magnetic member 4 on both ends of the laminated structure 3 in the laminated direction, it is possible to come even closer to a closed magnetic path, thereby further enhancing the effects described above.

Figure 4:
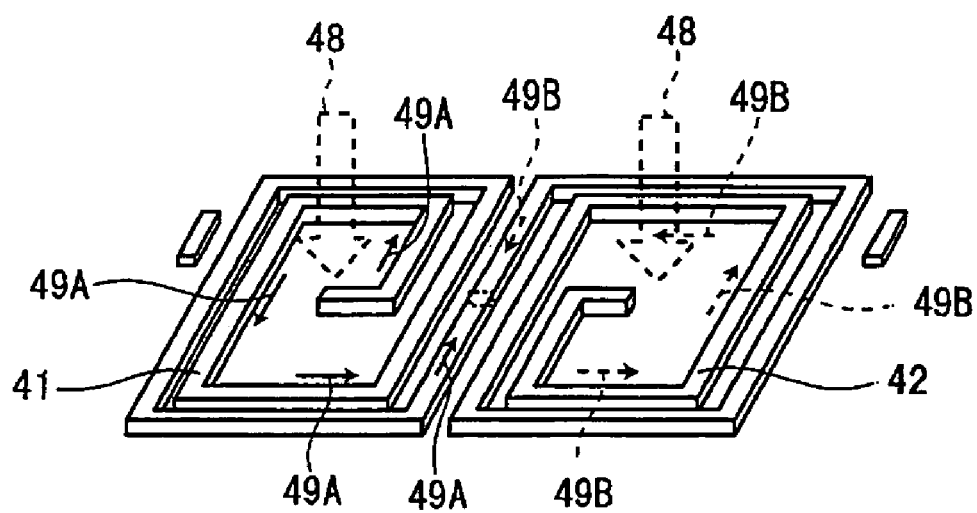
FIG. 4 is an explanatory diagram illustrating the flow of an electric current or voltage in the common mode choke coil of the preferred embodiment in response to external magnetic noise.

According to Lenz's Law, if an external magnetic noise 48 enters the first and second coil patterns 41 and 42, as shown in FIG. 4, an electric current flows through the first coil pattern 41 in a direction indicated by arrows 49A, while another electric current flows through the second coil pattern 42 in a direction indicated by arrows 49B. Since the first and second coil patterns 41 and 42 are symmetrical to each other about the point of connection, the currents flowing through the first and second coil patterns 41 and 42 are approximately the same and, hence, cancel each other out, leaving almost no residual current. Accordingly, this construction effectively prevents noise from being produced in the signal transmission circuit.

Figure 5:
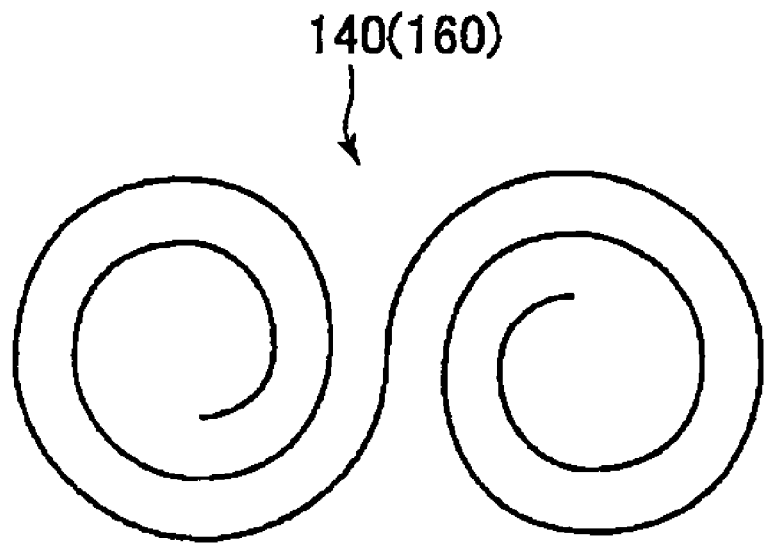
FIG. 5 is an explanatory diagram illustrating a variation of the shape of the first or second coil element in the common mode choke coil of the preferred embodiment.
Figure 6:
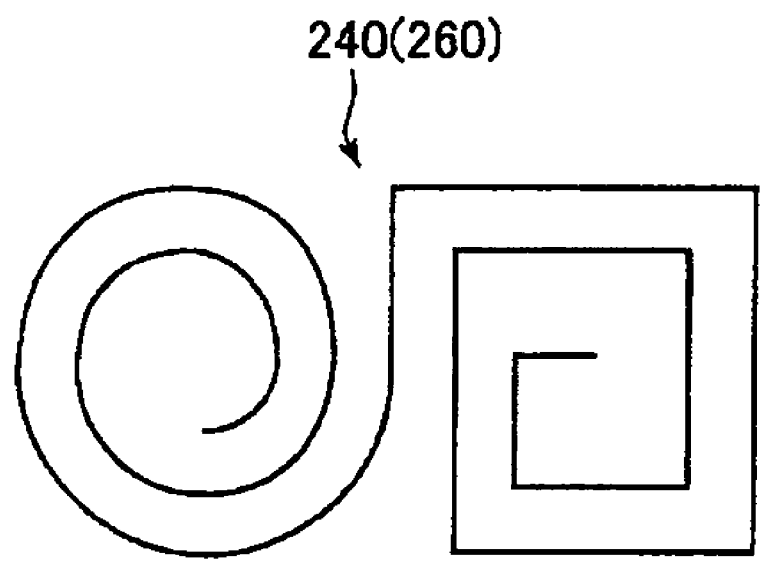
FIG. 6 is an explanatory diagram illustrating another variation of the shape of the first or second coil element in the common mode choke coil of the preferred embodiment.

While a common mode choke coil according to the present invention has been described in detail with reference to specific embodiments thereof, it would be apparent to those skilled in the art that many modifications and variations may be made therein without departing from the spirit of the invention, the scope of which is defined by the attached claims. For example, the shape of the first coil element 40 or second coil element 60 is not limited to the shape described in the preferred embodiment, but may be modified to a first coil element 140 or a second coil element 160 having the shape shown in FIG. 5. Further, the shape of the first coil element 40 or the second coil element 60 need not be symmetrical about a point, but may be asymmetrical, as in a first coil element 240 or a second coil element 260 shown in FIG. 6

Further, while the first coil pattern 41 and the third coil pattern 61 are disposed in opposition to each other in the preferred embodiment, these components need not be disposed opposite each other, provided that they are magnetically coupled. Similarly, the second coil pattern 42 and fourth coil pattern 62 need not be positioned opposite each other.

What is claimed is:

1. A common mode choke coil comprising:
    a laminate structure comprising a plurality of insulating layers, a first coil element, and a second coil element,
        the first coil element comprising a first coil pattern having two first ends and a spiral shape therebetween, and a second coil pattern having two second ends, one of the second ends being connected to one of the first ends, and a spiral shape wound in the same direction as the first coil pattern;
        the second coil element disposed adjacent to the first coil element with one of the plurality of insulating layers interposed therebetween, the second coil element comprising a third coil pattern capable of being magnetically coupled to the first coil pattern and having two third ends with a spiral shape wound in the same direction as the first coil pattern, and a fourth coil pattern capable of being magnetically coupled to the second coil pattern and having two fourth ends, one of the fourth ends being connected to one of the third ends, and a spiral shape wound in the same direction as the third coil pattern;
    first, second, third, and fourth external electrodes formed on side surfaces of the laminated structure;
    a first magnetic member disposed on a surface of the laminated structure perpendicular to a laminating direction;
    a second magnetic member disposed on another surface of the laminated structure perpendicular to the laminating direction;
    first and second lead-out parts disposed between two of the insulating layers adjacent to each other on a side of the first coil element opposite the second coil element; and
    third and fourth lead-out parts disposed between another two of the insulating layers adjacent to each other on a side of the second coil element opposite the first coil element;
    wherein the insulating layer interposed between the first and second coil patterns and the first and second lead-out parts has a first through-hole and a second through-hole formed therethrough,
    the insulating layer interposed between the third and fourth coil patterns and the third and fourth lead-out parts has a third through-hole and a fourth through-hole formed therethrough,
    one end of the first lead-out portion leads out to the side surface, where the first external electrode is formed, of the laminated structure and is connected to the first external electrode, while another end of the first lead-out portion is connected to one of the first ends through the first through-hole formed in the insulating layer between one of the first ends and the first lead-out portion,
    one end of the second lead-out portion leads out to the side surface, where the second external electrode is formed, of the laminated structure and is connected to the second external electrode, while another end of the second lead-out portion is connected to one of the second ends through the second through-hole formed in the insulating layer between one of the second ends and the second lead-out part,
    one end of the third lead-out portion leads out to the side surface, where the third external electrode is formed, of the laminated structure and is connected to the third external electrode, while another end of the third lead-out portion is connected to one of the third ends through the third through-hole formed in the insulating layer between one of the third ends and the third lead-out part, and
    one end of the fourth lead-out portion leads out to the side surface, where the fourth external electrode is formed, of the laminated structure and is connected to the fourth external electrode, while another end of the fourth lead-out portion is connected to one of the fourth ends through the fourth through-hole formed in the insulating layer between one of the fourth ends and the fourth lead-out part.

2. The common mode choke coil according to claim 1, wherein the first coil pattern and the second coil pattern are symmetrical about a center point where one of the first ends connects with one of the second ends; and the third coil pattern and the fourth coil pattern are symmetrical about a center point where one of the third ends connects with one of the fourth ends.

3. The common mode choke coil according to claim 2, wherein the first coil pattern is shaped substantially identical to the third coil pattern, and the second coil pattern is shaped substantially identical to the fourth coil pattern.

4. The common mode choke coil according to claim 3, wherein the first coil pattern is disposed opposite the third coil pattern, and the second coil pattern is disposed opposite the fourth coil pattern.

5. The common mode choke coil according to claim 1, wherein the spiral shapes of the first, second, third, and fourth coil patterns are formed of at least one of curved and straight lines.

6. The common mode choke coil according to claim 5, wherein the spiral shapes of the first, second, third, and fourth coil patterns have a substantially circular appearance.

7. The common mode choke coil according to claim 5, wherein the spiral shapes of the first, second, third, and fourth coil patterns are square shapes.

* * * * *